(12) United States Patent
Bu

(10) Patent No.: US 7,532,496 B1
(45) Date of Patent: May 12, 2009

(54) SYSTEM AND METHOD FOR PROVIDING A LOW VOLTAGE LOW POWER EPROM BASED ON GATE OXIDE BREAKDOWN

(75) Inventor: Jiankang Bu, Windham, ME (US)

(73) Assignee: National Semiconductor Corporation, Santa Clara, CA (US)

( * ) Notice: Subject to any disclaimer, the term of this patent is extended or adjusted under 35 U.S.C. 154(b) by 46 days.

(21) Appl. No.: 11/708,956

(22) Filed: Feb. 21, 2007

(51) Int. Cl.
G11C 17/00 (2006.01)
(52) U.S. Cl. .................. 365/94; 365/187; 365/185.18; 365/185.27; 365/149; 365/150
(58) Field of Classification Search .................. 365/187, 365/185.26, 185.18, 185.27, 149, 150
See application file for complete search history.

(56) References Cited

U.S. PATENT DOCUMENTS

| | | | | |
|---|---|---|---|---|
| 6,044,012 A | * | 3/2000 | Rao et al. | 365/182 |
| 7,209,392 B2 | * | 4/2007 | Chen et al. | 365/185.26 |
| 2006/0104122 A1 | * | 5/2006 | Choy | 365/185.29 |

OTHER PUBLICATIONS

Fliesler et al., A novel embedded OTP NVM using standard foundry CMOS logic technology, ICMTD-2005, all three (3) pages.*
Kim et al., Three-Transistor One-Time Programmable (OTP) ROM Cell Array Using Standard CMOS Gate Oxide Antifuse, 2003, all three (3) pages.*

* cited by examiner

Primary Examiner—Huan Hoang
Assistant Examiner—Fernando N Hidalgo

(57) ABSTRACT

A system and method are disclosed for providing an electrically programmable read only memory (EPROM) in which each memory cell comprises an NMOS select transistor and a PMOS program transistor with a thick gate oxide and a PMOS breakdown transistor with a thin gate oxide. The source of the NMOS transistor and the source, drain and N well of the PMOS breakdown transistor are connected. The gate of the PMOS breakdown transistor is connected to the PMOS program transistor. The memory cell is programmed by two voltage pulses that are passed to the N well of the PMOS breakdown transistor. The combined voltage of the two pulses is sufficient to break the thin gate oxide of the PMOS breakdown transistor. Because the memory state of the memory cell depends on the breakdown status of the PMOS breakdown transistor, the data may be retained in the memory cell for an unlimited period of time.

24 Claims, 5 Drawing Sheets

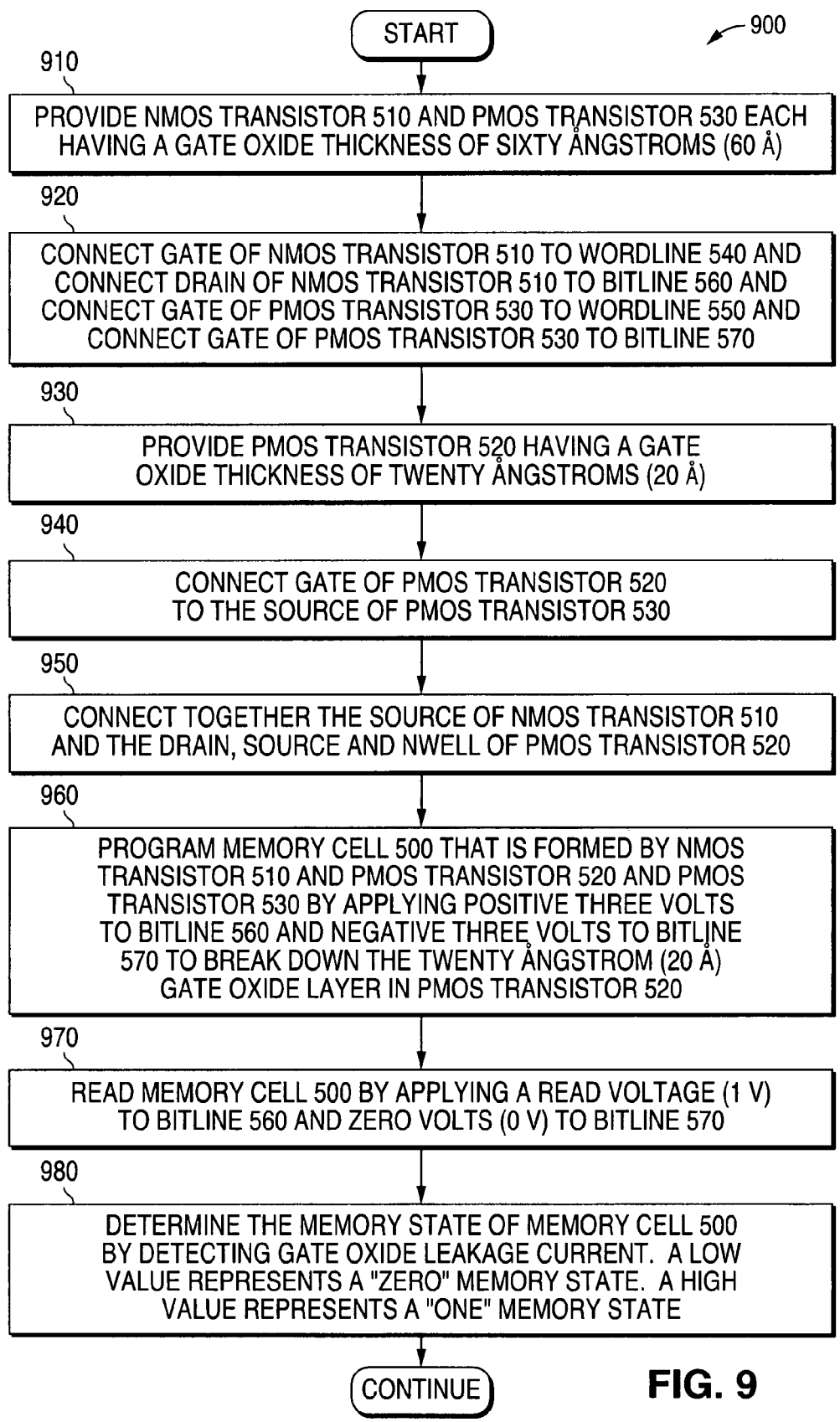

SYSTEM AND METHOD FOR PROVIDING A LOW VOLTAGE LOW POWER EPROM BASED ON GATE OXIDE BREAKDOWN

CROSS REFERENCE TO RELATED APPLICATION

A related patent application is being filed concurrently with this patent application. The related patent application is entitled "System and Method for Providing an EPROM with Different Gate Oxide Thicknesses" and has been assigned Ser. No. 11/709,290. The related patent application and the inventions disclosed therein are assigned to the assignee of the present invention and are incorporated herein by reference for all purposes as if fully set forth herein.

TECHNICAL FIELD OF THE INVENTION

The present invention is generally directed to the manufacture of integrated circuits and, in particular, to a system and method for providing an improved electrically programmable read only memory (EPROM) device.

BACKGROUND OF THE INVENTION

Electrically programmable read only memory (EPROM) must maintain the integrity of stored data for ten (10) years. In a memory cell of a prior art EPROM hot electrons are generated by impact ionization in a channel. Then some of the channel hot electrons are injected through a tunnel oxide to a polysilicon floating gate. Electrons (in amounts that represent either a zero ("0") representation or a one ("1") representation) are injected to the floating gate. The electron concentration in the floating gate determines the state of the data (i.e., "zero" or "one") that is stored in the memory cell.

The thickness of the tunnel oxide between the floating gate and the substrate in a prior art EPROM is typically one hundred twenty Angstroms (120 Å). An Angstrom is $10^{-10}$ meter. A value of thickness of the tunnel oxide of 120 Å is sufficient to reduce the back-tunnel current to acceptable levels and maintain a sufficient number of electrons on the floating gate to meet the ten (10) year data integrity requirement at a temperature of one hundred twenty five degrees Celsius (125° C.).

Integrated circuit design continues to trend toward smaller and smaller dimensions. EPROM designs have recently been proposed in which the thickness of the tunnel oxide is sixty Angstroms (60 Å). This presents difficulties because the thinner thickness of sixty Angstroms (60 Å) will not provide as much isolation for the electrons on the floating gate. That is, the electrons that are stored on the floating gate will discharge to the substrate at a much faster rate when the tunnel oxide is thinner. Experience in the EPROM industry has shown that it is very difficult to obtain a ten (10) year data retention rate when the thickness of the tunnel oxide is reduced to a thickness of sixty Angstroms (60 Å). Complex and expensive measures are required to ensure that a ten (10) data retention rate can be maintained in an EPROM that has a tunnel oxide that is only sixty Angstroms (60 Å) thick.

Therefore, there is a need in the art for a system and method that is capable of providing an EPROM that has a tunnel oxide layer that is sixty Angstroms (60 Å) thick and that is also capable of meeting the ten (10) year data retention requirement.

One advantageous embodiment of the present invention provides an electrically programmable read only memory (EPROM) memory cell that comprises (1) an n-channel metal oxide semiconductor (NMOS) select transistor with a gate oxide layer that is sixty Angstroms (60 Å) thick, and (2) a p-channel metal oxide semiconductor (PMOS) breakdown transistor with a gate oxide layer that is twenty Angstroms (20 Å) thick, and (3) an p-channel metal oxide semiconductor (PMOS) program transistor with a gate oxide layer that is sixty Angstroms (60 Å) thick. The source of the NMOS select transistor and the source, drain and N well of the PMOS breakdown transistor are connected. The gate of the PMOS breakdown transistor is connected to the source of the PMOS program transistor.

The NMOS select transistor provides a first program voltage pulse to the N well of the PMOS transistor of a selected memory cell. The PMOS program transistor provides a second program voltage pulse to the N well of the PMOS transistor of the selected memory cell. The magnitude of the two combined voltage pulses is sufficient to break the twenty Angstrom (20 Å) thickness of the gate oxide layer of the PMOS transistor. Because the memory state of the memory cell depends on the breakdown status of the PMOS breakdown transistor, the data may be retained in the memory cell for an unlimited period of time.

Before undertaking the Detailed Description of the Invention below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

Definitions for certain words and phrases are provided throughout this patent document, those of ordinary skill in the art should understand that in many, if not most instances, such definitions apply to prior uses, as well as to future uses, of such defined words and phrases.

BRIEF DESCRIPTION OF THE DRAWINGS

For a more complete understanding of the present invention and its advantages, reference is now made to the following description taken in conjunction with the accompanying drawings, in which like reference numerals represent like parts:

FIG. 9 illustrates a flow chart showing the steps of an advantageous embodiment of a method of the present invention.

DETAILED DESCRIPTION OF THE INVENTION

FIGS. 1 through 9, discussed below, and the various embodiments used to describe the principles of the present invention in this patent document are by way of illustration only and should not be construed in any way to limit the scope of the invention. Those skilled in the art will understand that the principles of the present invention may be implemented with any type of suitably arranged semiconductor device.

Figure 1:
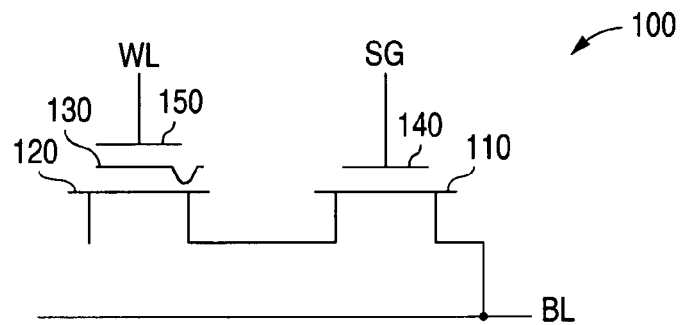
FIG. 1 illustrates a schematic diagram of a portion of a prior art electrically erasable programmable read only memory (EEPROM) device.

FIG. 1 illustrates a schematic diagram 100 of a portion of a prior art electrically erasable programmable read only memory (EEPROM) device. The portion of the prior art EEPROM shown in FIG. 1 comprises a select transistor 110 and a program transistor 120. The program transistor 120 comprises a floating gate 130. A tunnel oxide layer (not shown in FIG. 1) is located underneath the floating gate 130. Portions of the tunnel oxide layer form a tunnel window through which hot electrons are injected into the floating gate 130.

The gate 140 of the select transistor 110 is designated with the letters SG (for select gate). The source of the select transistor 110 is connected to a bitline voltage (designated with the letters BL) of a memory cell (not shown). The gate 150 of the program transistor 120 is connected to a wordline voltage (designated with the letters WL) of the memory cell (not shown).

Figure 2:
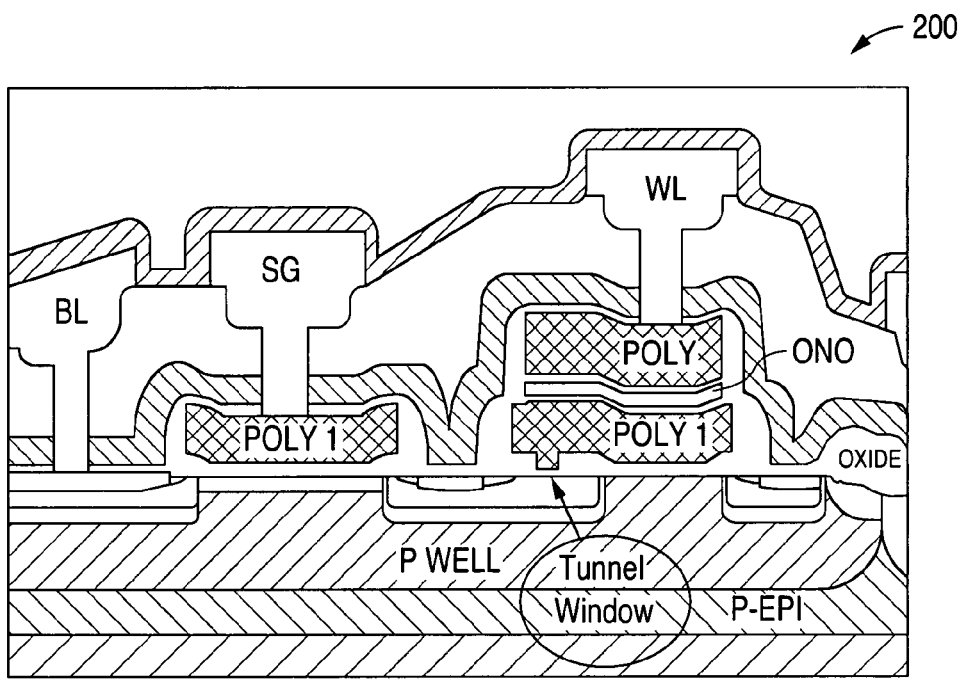
FIG. 2 illustrates a diagram of a cross section of a portion of a prior art electrically erasable programmable read only memory (EEPROM) device.

FIG. 2 illustrates a diagram 200 of a cross sectional view of a portion of a prior art electrically erasable programmable read only memory (EEPROM) device. As shown in FIG. 2, a relatively thin tunnel window is formed in the tunnel oxide layer under the floating gate (designated POLY1) of the program transistor.

The select transistor 110 selectively passes a bitline voltage BL from the bitline to the tunnel window. Depending on the relative value of the wordline voltage WL and the bitline voltage BL, a high value of electric field across the tunnel window will cause electron Fowler-Nordheim (FN) tunneling to the floating gate 130 or tunneling back from the floating gate 130 to the substrate.

If the voltage across the tunnel window is sufficiently high, or if the thickness of the tunnel window is sufficiently thin, then the Fowler-Nordheim (FN) tunneling process will change to an oxide breakdown process. The system and method of the present invention uses this phenomenon to provide an improved EPROM memory cell.

Figure 3:
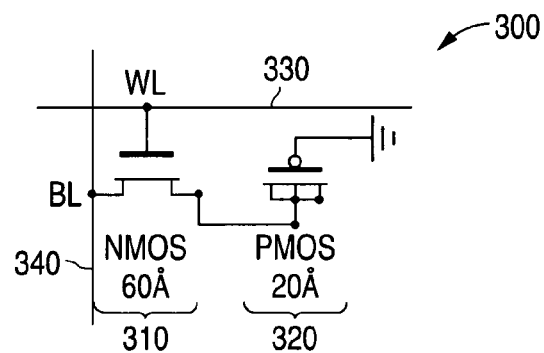
FIG. 3 illustrates a schematic diagram of a memory cell of the present invention showing an electrically programmable read only memory (EPROM) device of the present invention.

FIG. 3 illustrates a schematic diagram of a memory cell 300 of the present invention showing an advantageous embodiment of an electrically programmable read only memory (EPROM) device of the present invention. The EPROM memory cell 300 of the present invention comprises an n-channel metal oxide semiconductor (NMOS) select transistor 310 and a p-channel metal oxide semiconductor (PMOS) breakdown transistor 320. In the advantageous embodiment of the EPROM memory cell 300 shown in FIG. 3, the NMOS select transistor 310 has a gate oxide thickness of sixty Angstroms (60 Å) and the PMOS breakdown transistor 320 has a gate oxide thickness of twenty Angstroms (20 Å). The NMOS select transistor 310 also functions as a read transistor for the memory cell 300.

As shown in FIG. 3, the gate of the NMOS select transistor 310 is connected to a wordline 330 designated with the letters WL. The drain of the NMOS select transistor 310 is connected to a bitline 340 designated with the letters BL.

The gate of the PMOS breakdown transistor 320 is connected to ground. The source of the NMOS select transistor 310, and the drain, the source and the N Well of the PMOS breakdown transistor 320 are all connected together.

Figure 4:
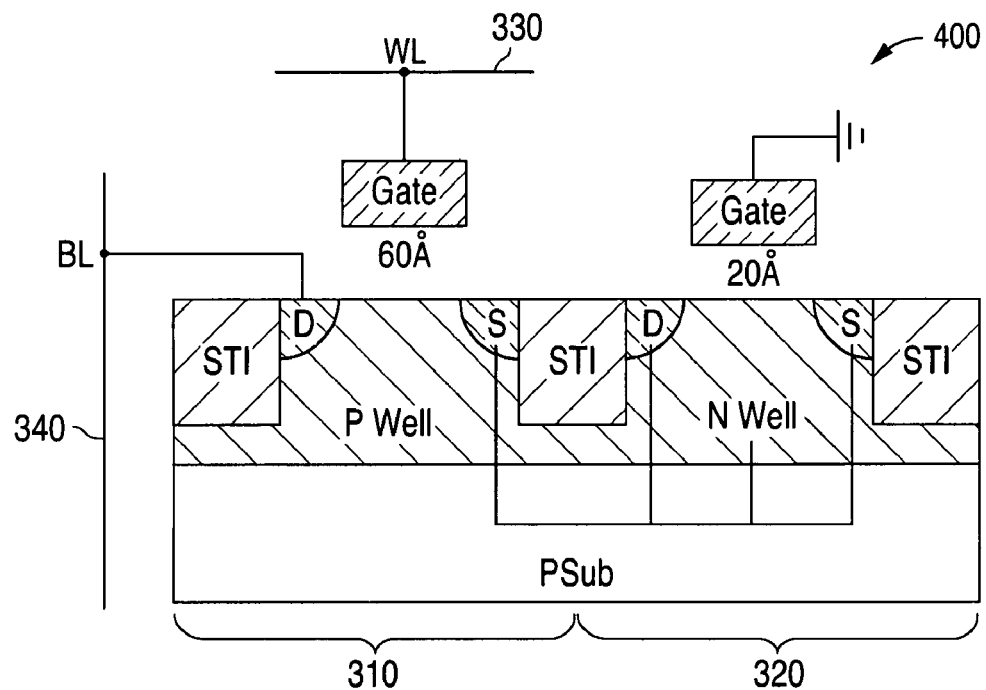
FIG. 4 illustrates a cross sectional view of a memory cell of the present invention shown in FIG. 3 showing a cross sectional view of an electrically programmable read only memory (EPROM) device of the present invention.

FIG. 4 illustrates a cross sectional view 400 of a memory cell 300 of the present invention. The letters STI in FIG. 4 stand for "shallow trench isolation" structures that electrically isolate the NMOS select transistor 310 and the PMOS breakdown transistor 320. The letters "PWell" designate the P well of the NMOS transistor 310. The letters "NWell" designated the N well of the PMOS breakdown transistor 320. The letters "PSub" designated the P substrate of the transistors 310 and 320.

Under the control of the NMOS select transistor 310, a program voltage pulse is selectively passed to the N Well of the PMOS breakdown transistor 320. The magnitude of the program voltage pulse is selected so that it is sufficient to break the twenty Angstrom (20 Å) gate oxide of the PMOS breakdown transistor 320. The magnitude of the program voltage pulse is also selected so that it is insufficient to damage the sixty Angstrom (60 Å) gate oxide (or any other portion) of the NMOS select transistor 310.

The EPROM memory cell 300 of the present invention is organized so that (1) the voltage on the wordline (WL) 330 controls the on and off status of the NMOS select transistor 310, and (2) the voltage on the bitline (BL) 340 provides the program voltage and the read value. The sequence and timing of the voltages that are provided to the wordline (WL) 330 and to the bitline (BL) 340 determine which memory cell in a memory array is to be programmed or read.

During the programming operation of memory cell 300, a voltage is provided to the wordline (WL) 330 that turns on the NMOS select transistor 310. The program voltage that is present on the bitline (BL) 340 is thus provided to the twenty Angstrom (20 Å) gate oxide of the PMOS breakdown transistor 320. As previously mentioned, the magnitude of the program voltage is sufficient to break down the twenty Angstrom (20 Å) gate oxide layer of the PMOS break down transistor 320 but is insufficient to damage the damage the sixty Angstrom (60 Å) gate oxide layer (or any other portion) of the NMOS select transistor 310. The difference of forty Angstroms (40 Å) between the first gate oxide thickness of sixty Angstroms (60 Å) of the NMOS select transistor 310 and the second gate oxide thickness of twenty Angstroms (20 Å) of the PMOS breakdown transistor 320 provides a sufficient margin to ensure that the NMOS select transistor 310 is not damaged.

Before the application of the programming process that breaks down the twenty Angstrom (20 Å) gate oxide thickness, the low gate oxide leakage current through PMOS breakdown transistor 320 represents a "zero" memory state. A typical value of the low gate oxide leakage current may range from ten nanoamperes (10 nA) to one hundred nanoamperes (100 nA) for a read bias voltage of one volt (1V).

After the twenty Angstrom (20 Å) gate oxide thickness of the PMOS breakdown transistor 320 has been broken down by the programming process, the high gate oxide leakage current through PMOS breakdown transistor 320 represents a "one" memory state. A typical value of the high gate oxide leakage current may range from one hundred microamperes (100 μA) to three hundred microamperes (300 μA). In contrast, the post programming breakdown current in prior art circuits such as poly fuse or anti-fuse technologies may be as high as one hundred milliamperes (100 mA).

During the read operation of memory cell 300, a voltage is provided to the wordline (WL) 330 that turns on the NMOS select transistor 310 and a low read bias voltage is provided to the bitline (BL) 340 of the memory cell 300. The NMOS select transistor 310 now functions as an NMOS read transistor 310. If the memory cell 300 has been previously programmed (i.e., the twenty Angstrom (20 Å) gate oxide thickness of the PMOS breakdown transistor 320 has been broken down), then the bitline (BL) 340 will read a high current that represents the "one" memory state. Otherwise, the bitline (BL) 340 will read a low current that represents the "zero" memory state.

Because the status of the memory state in memory cell 300 is determined by whether or not the twenty Angstrom (20 Å) gate oxide thickness of the PMOS breakdown transistor 320 has been broken down, the retention time of the data in memory cell 300 is infinitely long. The retention time is also not dependent on any known operating temperature that occurs in EPROM devices. Furthermore, unlike prior art memory cells, memory cell 300 of the present invention has no "read disturb" or "program disturb" issues with respect to any other memory cells in a memory array.

The amount of current that is required to carry out the programming process for memory cell 300 is in the range of ten microamperes (10 μA) to one hundred microamperes (100 μA). A microampere is one millionth ($10^{-6}$) of an ampere. Prior art polysilicon type fuse or antifuse technologies require programming currents that are in the range of tens of milliamperes (10s mA) to hundreds of milliamperes (100s mA). A milliampere is one thousandth ($10^{-3}$) of an ampere. Therefore, the programming current required for the memory cell 300 of the present invention is one thousand (1000) times lower than the programming currents that are required for prior art EPROM programming methods.

Table One shows operational voltages for a memory cell 300 of the type shown in FIG. 3.

TABLE ONE

|  | Selected WL | Selected BL | Unselected WL | Unselected BL |
|---|---|---|---|---|
| Program | Vhigh | Vprog | 0 | 0 |
| Read | Vlow | Vread | 0 | 0 |
| Retention | 0 | 0 | 0 | 0 |

An exemplary value of the WL high voltage (Vhigh) is seven volts (7 V). An exemplary value of the WL low voltage (Vlow) is two volts (2 V). An exemplary value of the BL program voltage (Vprog) is six volts (6 V). An exemplary value of the BL read voltage (Vread) is one volt (1 V).

During the programming operation of memory cell 300, the Vhigh voltage is provided to the selected wordline (WL) and the Vprog voltage is provided to the selected bitline (BL). Zero voltage is applied to the unselected wordlines (WL) and the unselected bitlines (BL) in an array (not shown) of memory cells 300. The Vprog voltage of six volts (6 V) is applied to and breaks down the twenty Angstrom (20 Å) gate oxide layer of the PMOS breakdown transistor 320.

The other unselected memory cells in an array (not shown) are not disturbed and are not programmed. This is because each of the unselected memory cells do not receive both a Vhigh voltage on their respective wordline WL and a Vprog voltage on their respective bitline BL. For a first example, if there is a Vhigh voltage on the wordline WL of an unselected memory cell then the NMOS transistor 310 of the unselected memory cell will turn on but the bitline BL voltage will be zero. In this first example the unselected memory cell will not be programmed.

For a second example, if there is a Vprog voltage on the bitline WL of an unselected memory cell but there is a zero voltage on the wordline WL, then the NMOS transistor 310 of the unselected memory cell will not turn on even though the Vprog voltage on bitline BL is high. In this second example the unselected memory cell will not be programmed.

The system and method of the present invention is therefore capable of selectively programming one particular memory cell 300 in an array (not shown) of memory cells 300.

During the read operation of memory cell 300, the Vlow voltage is provided to the selected wordline (WL) and the Vread voltage is provided to the selected bitline (BL). Zero voltage is applied to the unselected wordlines (WL) and unselected bitlines (BL). The result of the read operation depends on the status of the twenty Angstrom (20 Å) gate oxide layer of the PMOS break down transistor 320 (whether the gate oxide layer is broken down or is still intact). If a high gate oxide leakage current is detected the twenty Angstrom (20 Å) gate oxide layer has been broken down and the memory state in memory cell 300 is a "one" memory state. If a low gate oxide leakage current is detected the twenty Angstrom (20 Å) gate oxide layer is still intact and the memory state in the memory cell 300 is a "zero" memory state.

During the read operation of memory cell 300, the other unselected memory cells in the array see only the Vlow voltage on their respective wordline line WL or the Vread voltage on their respective bitline BL (but not both voltages). Therefore, the other unselected memory cells in the array do not contribute to the read current.

The system and method of the present invention is therefore capable of selectively reading one particular memory cell 300 in an array of memory cells 300.

The other unselected memory cells in the array are not disturbed during a read operation. The memory state of a memory cell 300 of the present invention depends on the breakdown status of the oxide layer in the PMOS breakdown transistor 320. Therefore, there is no "read disturb" to the data retention. Prior art technologies that store data by retaining electrons on a floating gate sometimes experience a disturbance when an adjacent memory cell is read. A memory cell 300 of the present invention does not experience "read disturb" problems.

It is true that the Vread voltage could damage the twenty Angstrom (20 Å) gate oxide layer in the PMOS breakdown transistor 320 if the magnitude of the Vread voltage were set too high. However, because the Vread voltage is one volt (1 V) or less, the twenty Angstrom (20 Å) gate oxide layer will remain undamaged by the Vread voltage.

Because the memory state of a memory cell 300 of the present invention depends on the breakdown status of the oxide layer in the PMOS breakdown transistor 320, the retention time for memory cell 300 is infinite in duration. Memory cell 300 has no erase capability. Lack of an erase capability is acceptable for an EPROM device.

As will be described more fully below, the memory cell 300 may be improved by adding another PMOS transistor that has a sixty Angstrom (60 Å) gate oxide layer. One disadvantage of memory cell 300 is that the program voltage of six volts (6 V) is not an operational voltage for a complementary metal oxide semiconductor (CMOS). The program voltage of six volts (6 V) has to be generated by an on-chip charge pump or provided by an outside power source. Therefore, it would be desirable to provide an EPROM memory cell that used a CMOS compatible program voltage.

Another disadvantage of memory cell 300 is that the higher program voltage of six volts (6 V) creates a higher bitline leakage current because of the reverse drain junction's leakage current. Therefore, it would be desirable to provide an EPROM memory cell that operates at a lower voltage and lower power level and at the same time does not diminish the performance of the EPROM memory cell.

Figure 5:
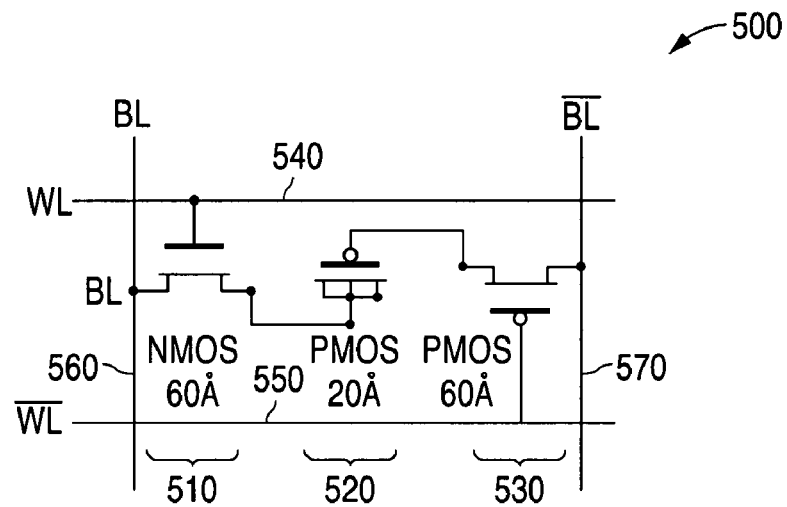
FIG. 5 illustrates a schematic diagram of a memory cell of the present invention showing an electrically programmable read only memory (EPROM) device of the present invention.

The memory cell 500 of the present invention provides a low voltage, low power EPROM memory cell. As shown in FIG. 5, the EPROM memory cell 500 of the present invention comprises an NMOS select transistor 510 and a PMOS breakdown transistor 520 and a PMOS program transistor 530. In the advantageous embodiment of the EPROM memory cell 500 shown in FIG. 5, the NMOS select transistor 510 has a gate oxide thickness of sixty Angstroms (60 Å). The PMOS breakdown transistor 520 has a gate oxide thickness of twenty Angstroms (20 Å). The PMOS program transistor 530 has a gate oxide thickness of sixty Angstroms (60 Å). The NMOS select transistor 510 and the PMOS program transistor 530 also function as read transistors for the memory cell 500.

As shown in FIG. 5, the gate of the NMOS select transistor 510 is connected to a wordline 540 designated with the letters WL. The gate of the PMOS program transistor 530 is connected to a wordline bar 550 designated with the letters $\overline{WL}$. The drain of the NMOS select transistor 510 is connected to a bitline 560 designated with the letters BL. The drain of the PMOS program transistor 530 is connected to a bitline bar 570 designated with the letters $\overline{BL}$.

The source of the NMOS select transistor 510, and the drain, the source and the N Well of the PMOS breakdown transistor 520 are all connected together. The gate of the PMOS breakdown transistor 520 is connected to the source of the PMOS program transistor 530.

Figure 6:
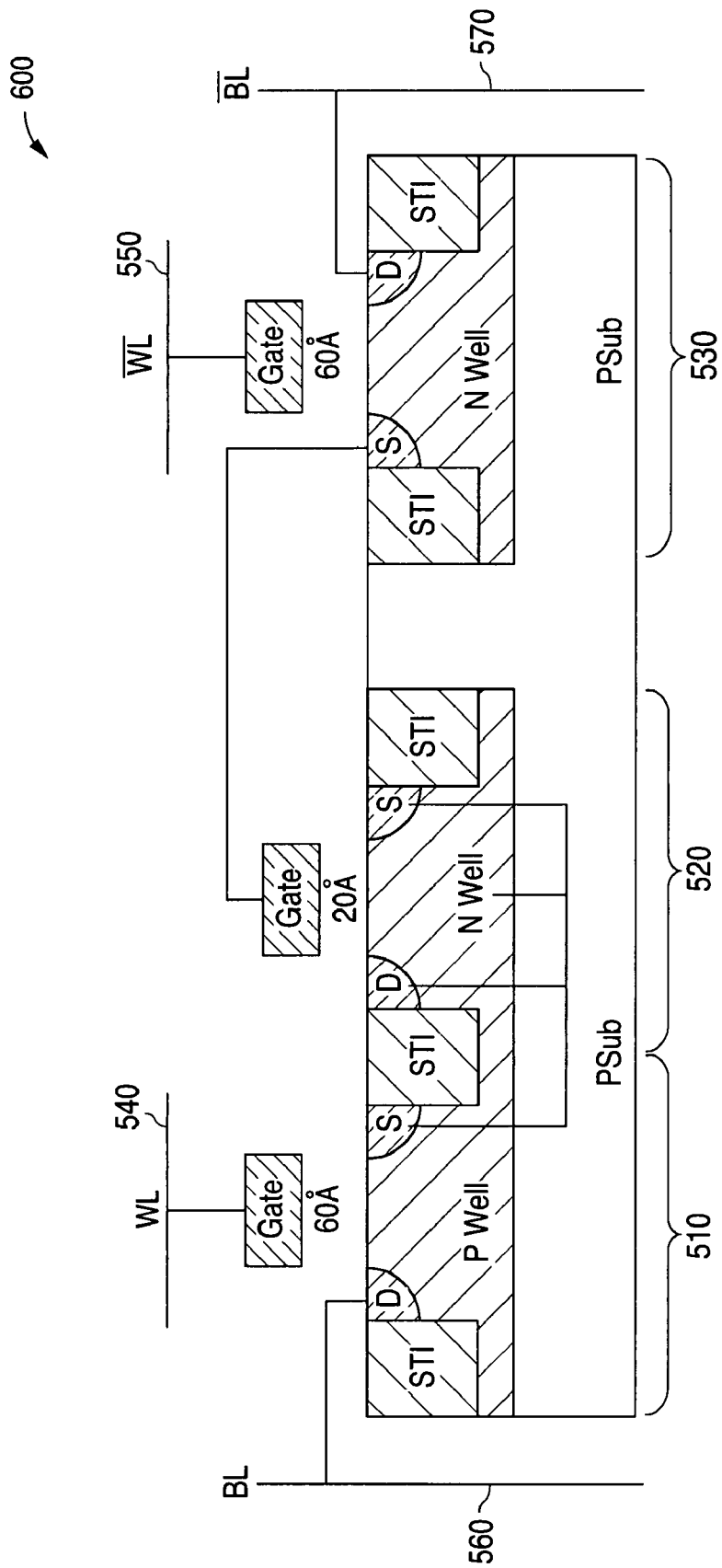
FIG. 6 illustrates a cross sectional view of a memory cell of the present invention shown in FIG. 5 showing a cross sectional view of an electrically programmable read only memory (EPROM) device of the present invention.

FIG. 6 illustrates a cross sectional view 600 of a memory cell 500 of the present invention. The letters STI in FIG. 6 stand for "shallow trench isolation" structures that electrically isolate the NMOS select transistor 510 and the PMOS breakdown transistor 520 and the PMOS program transistor 530. The letters "PWell" designate the P well of the NMOS transistor 510. The letters "NWell" designated the N well of the PMOS breakdown transistor 520 and the N well of the PMOS program transistor 530. The letters "PSub" designated the P substrate of the transistors 510 and 520 and 530.

During a programming operation, the NMOS select transistor 510 is turned on by applying an appropriate bias voltage (e.g., positive four volts (+4V)) to the wordline WL 540 and the PMOS program transistor 530 is turned on by applying an appropriate bias voltage (e.g., negative four volts (−4V)) to the wordline bar 550 $\overline{WL}$. Then a positive program voltage (e.g., +3V) is applied to the bitline BL 560 and a negative program voltage (e.g., −3V) is applied to the bitline bar $\overline{BL}$ 570.

The positive three volt (+3V) program voltage is passed from the NMOS select transistor 510 to the N well of the PMOS breakdown transistor 520. The negative three volt (−3V) program voltage is passed from the PMOS program transistor 530 to the gate of the PMOS breakdown transistor 520. The combined effect of these program voltages creates an effective six volt (6 V) voltage across the twenty Angstrom (20 Å) gate oxide layer of the PMOS breakdown transistor 520. The effective six volt (6 V) voltage causes the gate oxide layer of the PMOS breakdown transistor 520 to break down in less than one millisecond (1 ms). In this manner the memory cell 500 is programmed.

The three volt (3 V) magnitude of the program voltage pulse from the NMOS select transistor 510 is insufficient to damage the sixty Angstrom (60 Å) gate oxide (or any other portion) of the NMOS select transistor 510. The three volt (3 V) magnitude of the program voltage pulse from the PMOS program transistor 530 is insufficient to damage the sixty Angstrom (60 Å) gate oxide (or any other portion) of the PMOS program transistor 530.

Before the application of the programming process that breaks down the twenty Angstrom (20 Å) gate oxide thickness, the low gate oxide leakage current through PMOS breakdown transistor 520 represents a "zero" memory state. A typical value of the low gate oxide leakage current may range from ten nanoamperes (10 nA) to one hundred nanoamperes (100 nA) for a read bias voltage of one volt (1V).

After the twenty Angstrom (20 Å) gate oxide thickness of the PMOS breakdown transistor 520 has been broken down by the programming process, the high gate oxide leakage current through PMOS breakdown transistor 520 represents a "one" memory state. A typical value of the high gate oxide leakage current may range from one hundred microamperes (100 μA) to three hundred microamperes (300 μA). In contrast, the post programming breakdown current in prior art circuits such as poly fuse or anti-fuse technologies may be as high as one hundred milliamperes (100 mA).

During the read operation of memory cell 500, if the memory cell 500 has been previously programmed (i.e., the twenty Angstrom (20 Å) gate oxide thickness of the PMOS breakdown transistor 520 has been broken down), then the bitline (BL) 560 will read a high current that represents the "one" memory state. Otherwise, the bitline (BL) 560 will read a low current that represents the "zero" memory state.

Because the status of the memory state in memory cell 500 is determined by whether or not the twenty Angstrom (20 Å) gate oxide thickness of the PMOS breakdown transistor 520 has been broken down, the retention time of the data in memory cell 500 is infinitely long. The retention time is also not dependent on any known operating temperature that occurs in EPROM devices. Furthermore, unlike prior art memory cells, memory cell 500 of the present invention has no "read disturb" or "program disturb" issues with respect to any other memory cells in a memory array.

The amount of current that is required to carry out the programming process for memory cell 500 is in the range of ten microamperes (10 μA) to one hundred microamperes (100 μA). A microampere is one millionth ($10^{-6}$) of an ampere. Prior art polysilicon type fuse or antifuse technologies require programming currents that are in the range of tens of milliamperes (10s mA) to hundreds of milliamperes (100s mA). A milliampere is one thousandth ($10^{-3}$) of an ampere. Therefore, the programming current required for the memory cell 500 of the present invention is one thousand (1000) times lower than the programming currents that are required for prior art EPROM programming methods.

During a read operation, the NMOS select transistor 510 is turned on by applying an appropriate bias voltage (e.g., positive four volts (+4V)) to the wordline WL 540 and the PMOS program transistor 530 is turned on by applying an appropriate bias voltage (e.g., negative four volts (−4V)) to the wordline bar 550 $\overline{WL}$. Then a low read bias voltage (e.g., positive one volt (+1V)) is applied to the bitline BL 560 and the bitline bar $\overline{BL}$ 570 is grounded.

As previously mentioned, if the memory cell 500 has been programmed and the gate oxide layer of the PMOS breakdown transistor 520 has been broken, then the detected current will be a high gate oxide leakage current in the range of one hundred microamperes (100 μA) to three hundred microamperes (300 µA). If the memory cell 500 has not been programmed and the gate oxide layer of the PMOS breakdown transistor 520 has not been broken, then the detected current will be a low gate oxide leakage current in the range of ten nanoamperes (10 nA) to one hundred nanoamperes (100 nA).

The principles of the present invention may be generalized to any CMOS platform that comprises transistors with different gate oxide thicknesses. In general, high voltage (HV) (or medium voltage (MV)) NMOS transistors and high voltage (HV) (or medium voltage (MV)) PMOS transistors that have larger values of gate oxide thickness are used to differentially pass a program voltage to a low voltage (LV) PMOS breakdown transistor that has a smaller value of gate oxide thickness. Therefore, the present invention is not limited to the specific gate oxide thickness values of sixty Angstroms (60 Å) and twenty Angstroms (20 Å) described in the advantageous embodiment of the invention.

Because all of the operational bias voltages in the present invention are CMOS compatible, there is no need to employ an on-chip charge pump or an outside power source. This means that a product design that employs the present invention can be simpler, more cost effective, and more competitive. The use of lower voltage values enhances CMOS device reliability.

In addition, the present invention provides an advantage in that it has low levels of power consumption. During the programming operation, the program voltage is applied to the drain of NMOS select transistor 310 through bitline BL 560 and to the drain of PMOS program transistor 530 through bitline bar $\overline{BL}$ 570. The drain is in reverse mode.

Figure 7:
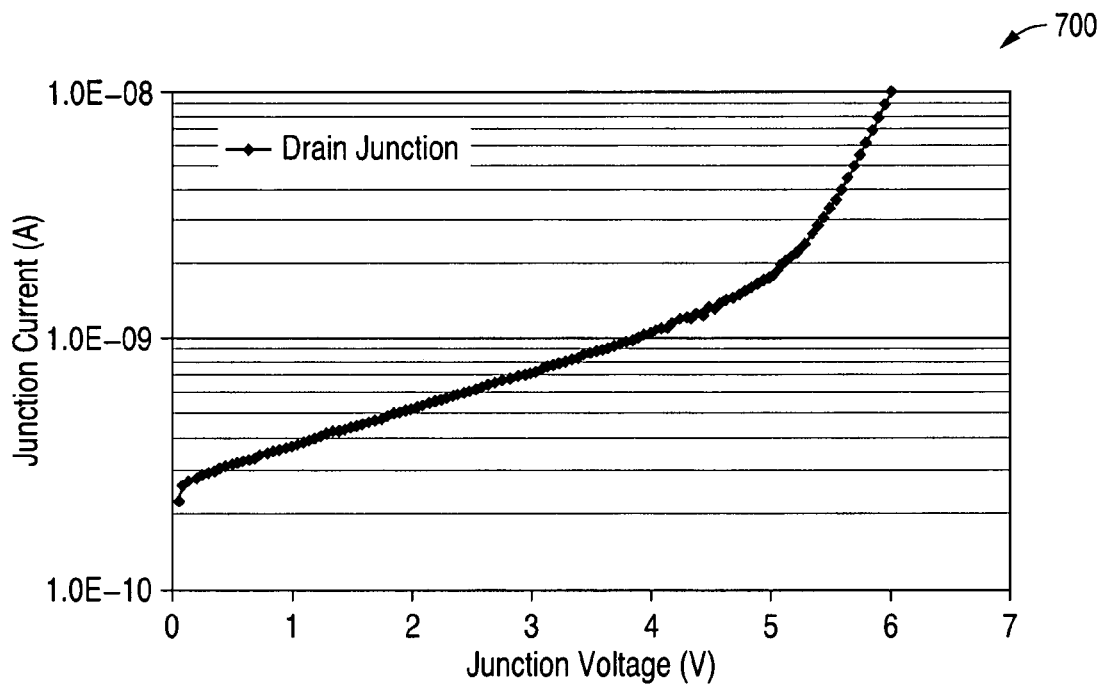
FIG. 7 illustrates a graph of drain junction current versus drain junction voltage.

FIG. 7 illustrates a graph of drain junction current versus drain junction voltage. As shown in FIG. 7, lower values of program voltage result in lower bitline leakage. There are other memory cells connected to the bitline whose drains are also reverse biased. Their gates are not turned on, however, so these other memory cells will not be programmed.

Due to the fact that the current-voltage (I-V) characteristic of the pn junction is not linear, decreasing the junction voltage by one half will reduce the drain junction leakage current by much more than one half. For example, referring to the current-voltage (I-V) characteristic shown in FIG. 7, if one uses a program voltage of six volts (6 V) to program memory cell 300, then the drain junction leakage current of memory cell 300 is ten nanoamperes (10 nA). If one splits the six volt (6 V) program voltage to a positive three volts (+3V) and to a negative three volts (–3V), as is done in memory cell 500, then the drain junction leakage current of memory cell 500 is reduced to one and four tenths of a nanoampere (1.4 nA). A linear one-half reduction would have reduced the current to only five nanoamperes (5.0 nA).

The memory cell 500 provides all the advantages of memory cell 300 except that an additional transistor (PMOS program transistor 530) must be added. This is not a significant drawback in EPROM applications because EPROM circuits are usually used in low density applications.

Figure 8:
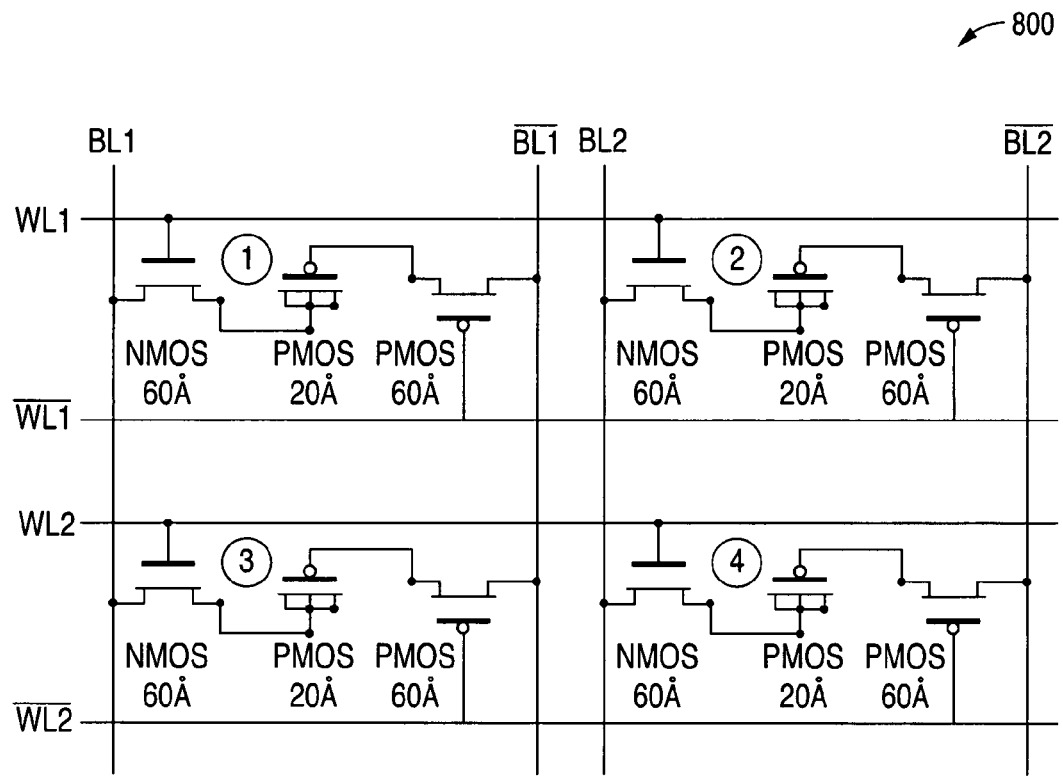
FIG. 8 illustrates a schematic diagram of an array of memory cells of the present invention in which each memory cell comprises an electrically programmable read only memory (EPROM) device of the present invention.

FIG. 8 illustrates a schematic diagram of an array 800 of memory cells 500 of the present invention. As shown in FIG. 8, array 800 comprises a plurality of four wordlines (WL1, $\overline{WL1}$, WL2, $\overline{WL2}$) and a plurality of four bitlines (BL1, $\overline{BL1}$, BL2, $\overline{BL2}$). The two memory cells 500 in the first row are designated Memory Cell 1 and Memory Cell 2. The two memory cells 500 in the second row are designated Memory Cell 3 and Memory Cell 4. Array 800 is merely one example of a memory cell array. It is understood that an array of memory cells 500 may contain any number of memory cells and is not limited to only four memory cells.

Array 800 is configured as an exemplary NOR type array architecture. However, the memory cell 500 of the present invention is not limited to this exemplary NOR type array architecture. The memory cell 500 of the present invention can also be used in other types of array architecture such as a NAND type array architecture.

Consider the programming of Memory Cell 4. A positive four volts (+4V) is applied to wordline WL2 and a negative four volts (–4V) is applied to wordline $\overline{WL2}$. A positive three volts (+3V) is applied to bitline BL2 and a negative three volts (–3V) is applied to bitline $\overline{BL2}$. A value of zero volts (0V) is applied to the other wordlines and bitlines. This effectively places a voltage of six volts (6V) across the twenty Angstrom (20 Å) gate oxide of the PMOS breakdown transistor 520 and breaks the gate oxide layer in less than one millisecond (1 ms).

Memory Cell 1 sees zero volts (0V) on all of its terminals. Therefore, Memory Cell 1 is not disturbed during the programming of Memory Cell 4.

Memory Cell 2 sees a positive three volts (+3V) on bitline BL2 and a negative three volts (–3V) on bitline $\overline{BL2}$. But because Memory Cell 2 sees zero volts (0V) on wordline WL1 and zero volts (0V) on wordline $\overline{WL1}$, its sixty Angstrom (60 Å) NMOS select transistor 510 is off and its sixty Angstrom (60 Å) PMOS program transistor 530 is off. Therefore, Memory Cell 2 is not disturbed during the programming of Memory Cell 4.

Memory Cell 3 sees a positive four volts (+4V) on wordline WL2 and a negative four volts (–4V) on wordline $\overline{WL2}$. This turns on its sixty Angstrom (60 Å) NMOS select transistor 510 and turns on its sixty Angstrom (60 Å) PMOS program transistor 530. But because Memory Cell 3 sees zero volts (0V) on bitline BL1 and sees zero volts (0V) on bitline $\overline{BL1}$, there is a value of zero volts (0V) on the PMOS breakdown transistor 520 of Memory Cell 3. Therefore, Memory Cell 3 is not disturbed during the programming of Memory Cell 4.

EPROM circuits are "one time programmable" (OTP) circuits. For this reason there are no EPROM erase operations.

Consider the read operation for Memory Cell 4. A positive four volts (+4V) is applied to wordline WL2 and a negative four volts (–4V) is applied to wordline $\overline{WL2}$. A positive one volt (+1V) is applied to bitline BL2 and a value of zero volts (0V) is applied to bitline $\overline{BL2}$. A value of zero volts (0V) is applied to the other wordlines and bitlines.

If the twenty Angstrom (20 Å) PMOS break down transistor 520 has been programmed, then a relatively "high" current of approximately one hundred microamperes (100 µA) will flow through bitline BL2. Otherwise, a relatively "low" current of approximately ten nanoamperes (10 nA) will flow through bitline BL2.

Memory Cell 1 sees zero volts (0V) on all of its terminals. Therefore, Memory Cell 1 is not disturbed during the reading of Memory Cell 4.

Memory Cell 2 sees a positive one volt (+1V) on bitline BL2 and a value of zero volts (0V) on bitline $\overline{BL2}$. Memory Cell 2 also sees zero volts (0V) on wordline WL1 and sees zero volts (0V) on wordline $\overline{WL1}$. This causes its sixty Angstrom (60 Å) NMOS select transistor 510 to be off and its sixty Angstrom (60 Å) PMOS program transistor 530 to be off. Therefore, Memory Cell 2 is not disturbed during the reading of Memory Cell 4.

Memory Cell 3 sees a positive four volts (+4V) on wordline WL2 and a negative four volts (–4V) on wordline $\overline{WL2}$. This turns on its sixty Angstrom (60 Å) NMOS select transistor 510 and turns on its sixty Angstrom (60 Å) PMOS program transistor 530. But because Memory Cell 3 sees zero volts (0V) on bitline BL1 and sees zero volts (0V) on bitline $\overline{BL1}$, there is zero volts (0V) on the PMOS breakdown transistor 520 of Memory Cell 3. Therefore, Memory Cell 3 is not disturbed during the reading of Memory Cell 4.

The memory cells 500 of the present invention do not require high current during the programming operation. After the programming operation has been completed, the memory cells 500 may be subjected to high levels of current. The effect of current spikes may be limited by adding a PMOS load to the bitlines to limit the maximum current experiences by the memory cells 500 to one hundred microamperes (100 μA). Alternatively, the width to length (W/L) ratio of the NMOS select transistors 510 may be reduced.

Generally speaking, gate oxide integrity (GOI) is one of the most well controlled, well documented and well understood parameters in a complementary metal oxide semiconductor (CMOS) platform. The present invention provides an improved EPROM device that is based on the principle of oxide breakdown. The improved EPROM device of the present invention uses features that are well suited for to be employed on existing CMOS platforms. The EPROM device of the present invention possesses the advantages of low cost, reliability, and a short technology development time.

The breakdown state of the EPROM device of the present invention can be maintained for hundreds of years in any known operating temperature that occurs in EPROM devices. For this reason the EPROM device of the present invention does not have the data retention problems that occur in some prior art technologies that utilize floating gate data storage.

The EPROM device of the present invention requires current on the order of microamperes (μA) to complete the programming operation. As previously mentioned, this level of current is one thousand (1000) times lower than the level of current required in prior art poly fuse technologies.

FIG. 9 illustrates a flow chart 900 showing the steps of an advantageous embodiment of the method of the present invention. In the first step of the method an NMOS select transistor 510 and a PMOS program transistor 530 are provided that each have a gate oxide thickness of sixty Angstroms (60 Å). (step 910). The gate of the NMOS select transistor 510 is connected to a wordline WL 540. The drain of the NMOS select transistor 510 is connected to a bitline BL 560. The gate of the PMOS program transistor 530 is connected to a wordline bar $\overline{WL}$ 550. The drain of the PMOS program transistor 530 is connected to a bitline bar BL 590. (step 920).

Then a PMOS breakdown transistor 520 is provided that has a gate oxide thickness of twenty Angstroms (20 Å). (step 930). Then the gate of the PMOS breakdown transistor 520 is connected to the source of the PMOS program transistor 530. (step 940). Then the source of the NMOS select transistor 510 and the drain, source and N Well of the PMOS breakdown transistor 520 are connected together. (step 950).

The memory cell 500 that is formed by the NMOS select transistor 510 and the PMOS breakdown transistor 520 and the PMOS program transistor 530 is then programmed. A positive four volts (+4V) is applied to the wordline WL 540 to turn on the NMOS select transistor 510 and a negative four volts (−4V) is applied to the wordline bar $\overline{WL}$ 550 to turn on the PMOS program transistor 530. Then the memory cell 500 is programmed by applying a positive three volts (+3V) to the bitline BL 560 and by applying a negative three volts (−3V) to the bitline bar $\overline{BL}$ 570 to break down the twenty Angstrom (20 Å) gate oxide layer in the PMOS breakdown transistor 520. (step 960).

Then the memory cell 500 is read by applying a read voltage (+1 V) to the bitline BL 560 and by applying a zero voltage to the bitline bar $\overline{BL}$ 570. (step 970). The memory state of the memory cell 500 is determined by determining the gate oxide leakage current. (step 980). A low value of gate oxide leakage current (e.g., from ten nanoamperes (10 nA) to one hundred nanoamperes (100 nA)) represents a "zero" memory state. A high value of gate oxide leakage current (e.g., from one hundred microamperes (100 μA) to three hundred microamperes (300 μA)) represents a "zero" memory state.

The value of thickness of the gate oxide layer in the NMOS select transistor 510 and in the PMOS program transistor 530 has been selected to be sixty Angstroms (60 Å). The value of thickness of the gate oxide layer in the PMOS breakdown transistor 520 has been selected to be twenty Angstroms (20 Å). It is understood that these values are not the only values of thickness that can be used to carry out the principles of operation of the EPROM device of the present invention.

The first gate oxide thickness of the NMOS select transistor 510 (and of the PMOS select transistor 530) must be thick enough so that it is not damaged when the second gate oxide thickness of the PMOS breakdown transistor 520 is subjected to sufficient current during the programming operation to cause the second gate oxide thickness to break. That is, there must be a sufficient oxide breakdown margin between the first gate oxide thickness and the second gate oxide thickness.

A sufficient oxide breakdown margin is provided when the first gate oxide thickness is sixty Angstroms (60 Å) and the second gate oxide thickness is twenty Angstroms (20 Å). However, the invention is not dependent upon using these specific values. Other values of thickness that provide a sufficient oxide breakdown margin may also be used.

It is possible that the thickness of the gate oxide layer in the PMOS program transistor 530 could be different from the thickness of the gate oxide layer in the NMOS select transistor 510. That is, although the present invention has been described with reference to an advantageous embodiment in which the thickness of the gate oxide layer is the same in both the NMOS select transistor 510 and the PMOS program transistor 530, it is understood that the another embodiment of the invention could be constructed in which the thickness of the gate oxide layer in the PMOS program transistor 530 could be different from the thickness of the gate oxide layer in the NMOS select transistor 510.

The foregoing description has outlined in detail the features and technical advantages of the present invention so that persons who are skilled in the art may understand the advantages of the invention. Persons who are skilled in the art should appreciate that they may readily use the conception and the specific embodiment of the invention that is disclosed as a basis for modifying or designing other structures for carrying out the same purposes of the present invention. Persons who are skilled in the art should also realize that such equivalent constructions do not depart from the spirit and scope of the invention in its broadest form.

Although the present invention has been described with an exemplary embodiment, various changes and modifications may be suggested to one skilled in the art. It is intended that the present invention encompass such changes and modifications as fall within the scope of the appended claims.

What is claimed is:

1. A memory cell of an electrically programmable read only memory (EPROM), the memory cell comprising:
   a select transistor that comprises an n-channel metal oxide semiconductor (NMOS) transistor having a gate oxide layer that has a first value of gate oxide thickness;
   a breakdown transistor connected to the select transistor, wherein the breakdown transistor comprises a p-channel metal oxide semiconductor (PMOS) transistor having a gate oxide layer that has a second value of gate oxide thickness; and a program transistor connected to the breakdown transistor, wherein the program transistor comprises a p-channel metal oxide semiconductor (PMOS) transistor wherein the NMOS select transistor provides a first value of voltage to the gate oxide layer of the PMOS breakdown transistor;

the PMOS program transistor provides a second value of voltage to the gate oxide layer of the PMOS breakdown transistor; and the combined value of voltage of the first and second values of voltage is sufficient to cause the gate oxide layer of the PMOS breakdown transistor to break down.

2. The memory cell as claimed in claim 1, wherein the first value of thickness of the gate oxide layer of the NMOS select transistor is approximately sixty Angstroms and the second value of thickness of the gate oxide layer of the PMOS breakdown transistor is approximately twenty Angstroms.

3. The memory cell as claimed in claim 2, wherein the thickness of the gate oxide layer of the PMOS program transistor is approximately sixty Angstroms.

4. The memory cell as claimed in claim 1, wherein a value of gate oxide leakage current through the PMOS breakdown transistor when the memory cell has not been programmed represents a memory state of zero in the NMOS select transistor; and a value of gate oxide leakage current through the PMOS breakdown transistor when the memory cell has been programmed represents a memory state of one in the NMOS select transistor.

5. The memory cell as claimed in claim 1, wherein a value of a programming current through the memory cell is in a range of ten microamperes to one hundred microamperes.

6. A memory cell of an electrically programmable read only memory (EPROM), the memory cell comprising:

a select transistor that comprises an n-channel metal oxide semiconductor (NMOS) transistor having a gate oxide layer that has a first value of gate oxide thickness;

a breakdown transistor connected to the select transistor, wherein the breakdown transistor comprises a p-channel metal oxide semiconductor (PMOS) transistor having a gate oxide layer that has a second value of gate oxide thickness; and a program transistor connected to the breakdown transistor, wherein the program transistor comprises a p-channel metal oxide semiconductor (PMOS) transistor wherein the NMOS select transistor comprises a drain connected to a first bitline of the memory cell;

a gate connected to a first wordline of the memory cell; and a source connected to the PMOS breakdown transistor wherein the PMOS breakdown transistor comprises a gate that is connected to the program transistor; and a source, a drain and an N well that are connected to the source of the NMOS select transistor.

7. The memory cell as claimed in claim 6, wherein the PMOS program transistor comprises a drain connected to a second bitline of the memory cell;

a gate connected to a second wordline of the memory cell; and a source connected to the gate of the PMOS breakdown transistor.

8. The memory cell as claimed in claim 7, wherein the first value of thickness of the gate oxide layer of the NMOS select transistor is approximately sixty Angstroms and the second value of thickness of the gate oxide layer of the PMOS breakdown transistor is approximately twenty Angstroms.

9. The memory cell as claimed in claim 8, wherein the thickness of the gate oxide layer of the PMOS program transistor is approximately sixty Angstroms.

10. The memory cell as claimed in claim 9, wherein the value of gate oxide leakage current through the PMOS breakdown transistor when the memory cell has not been programmed is in a range of ten nanoamperes to one hundred nanoamperes; and the value of gate oxide leakage current through the PMOS breakdown transistor when the memory cell has been programmed is in a range of one hundred microamperes to three hundred microamperes.

11. An electrically programmable read only memory (EPROM) device that comprises at least one memory cell that comprises:

a select transistor that comprises an n-channel metal oxide semiconductor (NMOS) transistor having a gate oxide layer that has a first value of gate oxide thickness;

a breakdown transistor connected to the select transistor, wherein the breakdown transistor comprises a p-channel metal oxide semiconductor (PMOS) transistor having a gate oxide layer that has a second value of gate oxide thickness; and a program transistor connected to the breakdown transistor, wherein the program transistor comprises a p-channel metal oxide semiconductor (PMOS) transistor wherein the NMOS select transistor provides a first value of voltage to the gate oxide layer of the PMOS breakdown transistor;

the PMOS program transistor provides a second value of voltage to the gate oxide layer of the PMOS breakdown transistor; and the combined value of voltage of the first and second values of voltage is sufficient to cause the gate oxide layer of the PMOS breakdown transistor to break down.

12. The electrically programmable read only memory (EPROM) device as claimed in claim 11, wherein the first value of thickness of the gate oxide layer of the NMOS select transistor is approximately sixty Angstroms and the second value of thickness of the gate oxide layer of the PMOS breakdown transistor is approximately twenty Angstroms.

13. The electrically programmable read only memory (EPROM) device as claimed in claim 12, wherein a value of thickness of the gate oxide layer of the PMOS program transistor is approximately sixty Angstroms.

14. The electrically programmable read only memory (EPROM) device as claimed in claim 11, wherein a value of gate oxide leakage current through the PMOS breakdown transistor when the memory cell has not been programmed represents a memory state of zero in the NMOS select transistor; and a value of gate oxide leakage current through the PMOS breakdown transistor when the memory cell has been programmed represents a memory state of one in the NMOS select transistor.

15. The electrically programmable read only memory (EPROM) device as claimed in claim 14, wherein the value of gate oxide leakage current through the PMOS breakdown transistor when the memory cell has not been programmed is in a range of ten nanoamperes to one hundred nanoamperes; and the value of gate oxide leakage current through the PMOS breakdown transistor when the memory cell has been programmed is in a range of one hundred microamperes to three hundred microamperes.

16. The electrically programmable read only memory (EPROM) device as claimed in claim 11, wherein a value of a programming current through the memory cell is in a range of ten microamperes to one hundred microamperes.

17. An electrically programmable read only memory (EPROM) device that comprises at least one memory cell that comprises:
- a select transistor that comprises an n-channel metal oxide semiconductor (NMOS) transistor having a gate oxide layer that has a first value of gate oxide thickness;
- a breakdown transistor connected to the select transistor, wherein the breakdown transistor comprises a p-channel metal oxide semiconductor (PMOS) transistor having a gate oxide layer that has a second value of gate oxide thickness; and
- a program transistor connected to the breakdown transistor, wherein the program transistor comprises a p-channel metal oxide semiconductor (PMOS) transistor, wherein
- the NMOS select transistor comprises a drain connected to a first bitline of a memory cell, and a gate connected to a first wordline of the memory cell, and a source connected to the PMOS breakdown transistor, and wherein
- the PMOS breakdown transistor comprises a gate that is connected to the program transistor, and a source, a drain and an N well that are connected to the source of the NMOS select transistor, and wherein
- the PMOS program transistor comprises a drain connected to a second bitline of the memory cell, and a gate connected to a second wordline of the memory cell, and a source connected to the gate of the PMOS breakdown transistor.

18. The electrically programmable read only memory (EPROM) device as claimed in claim 17, wherein the first value of thickness of the gate oxide layer of the NMOS select transistor is approximately sixty Angstroms and the second value of thickness of the gate oxide layer of the PMOS breakdown transistor is approximately twenty Angstroms.

19. The electrically programmable read only memory (EPROM) device as claimed in claim 18, wherein a value of thickness of the gate oxide layer of the PMOS program transistor is approximately sixty Angstroms.

20. A method of operating an array of electrically programmable read only memory (EPROM) memory cells, said method comprising the steps of:
- for each memory cell, connecting to a first wordline of the array a gate of an NMOS select transistor that has a gate oxide layer that has a first value of gate oxide thickness, and connecting a drain of the NMOS select transistor to a first bitline of the array, and connecting a source of the NMOS select transistor to a PMOS breakdown transistor that has a gate oxide layer that has a second value of gate oxide thickness;
- for each memory cell, connecting a gate of the PMOS breakdown transistor to a PMOS program transistor, and connecting a source, drain and N well of the PMOS breakdown transistor to the source of the NMOS select transistor; and
- for each memory cell, connecting a drain of the PMOS program transistor to a second bitline of the array, and connecting a gate of the PMOS program transistor to a second wordline of the array, and connect a source of the PMOS program transistor to the gate of the PMOS breakdown transistor.

21. The method as claimed in claim 20 wherein the first value of thickness of the gate oxide layer of the NMOS select transistor is approximately sixty Angstroms and the second value of thickness of the gate oxide layer of the PMOS breakdown transistor is approximately twenty Angstroms.

22. The method as claimed in claim 21 wherein a value of thickness of the gate oxide layer of the PMOS program transistor is approximately sixty Angstroms.

23. The method as claimed in claim 20, further comprising the step of:
- programming a selected memory cell of the array to a memory state one comprising the steps of:
- placing a first programming voltage on a first bitline of the selected memory cell;
- placing a second programming voltage on a second bitline of the selected memory cell; and
- breaking down the gate oxide layer of the PMOS breakdown transistor of the selected memory cell with the combined voltage of the first and second programming voltages.

24. The method as claimed in claim 20, further comprising the step of:
- determining a memory state of a selected memory cell of the array comprising the steps of:
- placing a read voltage on a first bitline of the selected memory cell;
- placing a zero voltage on a second bitline of the selected memory cell;
- determining the memory state of the selected memory cell from a value of gate oxide leakage current of the PMOS breakdown transistor.

* * * * *